(12) United States Patent
Gaertner et al.

(10) Patent No.: US 8,729,574 B2
(45) Date of Patent: May 20, 2014

(54) LIGHT EMITTING DEVICE BASED ON OLEDS

(75) Inventors: Georg Friedrich Gaertner, Aachen (DE); Hans-Peter Loebl, Monschau-Imgenbroich (DE)

(73) Assignee: Koninklijke Philips N.V., Eindhoven (NL)

( * ) Notice: Subject to any disclaimer, the term of this patent is extended or adjusted under 35 U.S.C. 154(b) by 122 days.

(21) Appl. No.: 13/381,388

(22) PCT Filed: Jun. 25, 2010

(86) PCT No.: PCT/IB2010/052914
§ 371 (c)(1),
(2), (4) Date: Mar. 9, 2012

(87) PCT Pub. No.: WO2011/001350
PCT Pub. Date: Jan. 6, 2011

(65) Prior Publication Data
US 2012/0153320 A1   Jun. 21, 2012

(30) Foreign Application Priority Data

Jul. 1, 2009 (EP) .................................. 09164317

(51) Int. Cl.
*H01L 33/00* (2010.01)
(52) U.S. Cl.
USPC .......... 257/89; 257/40; 257/98; 257/E33.069; 257/E27.119; 313/506
(58) Field of Classification Search
USPC .......... 257/89, 40, E27.119, 79, 98, E33.001, 257/E33.055, E33.067–E33.074; 438/22, 438/26–29; 313/506
See application file for complete search history.

(56) References Cited

U.S. PATENT DOCUMENTS

| 6,091,197 A * | 7/2000 | Sun et al. ....................... 313/509 |
| 2004/0032205 A1 * | 2/2004 | Hack et al. ...................... 313/504 |

(Continued)

FOREIGN PATENT DOCUMENTS

| EP | 0801429 A1 | 10/1997 | |
| EP | 1589584 | * 10/2005 | ............. H01L 27/15 |
| JP | 2002164170 A | 6/2002 | |

OTHER PUBLICATIONS

Vandersteegen et al., Light extraction for a doubly resonant cavity organic LED: the RC2LED, 2007, SPIE, Organic Light Emitting Materials and Devices XI, Proc. of SPIE, vol. 6655, 665513, all pages.*

(Continued)

*Primary Examiner* — Fernando L Toledo
*Assistant Examiner* — Victoria K Hall
(74) *Attorney, Agent, or Firm* — Mark L. Beloborodov

(57) ABSTRACT

A light emitting device includes several groups of stripe shaped organic light emitting diodes arranged side by side on an optically transparent carrier substrate. The organic light emitting diodes includes a first layer sequence forming a first microcavity. At least one of the organic light emitting diodes of each group includes a second layer sequence forming a second microcavity is adapted in thickness of at least one of its layers to increase light output of the corresponding organic light emitting diode. A scatter or diffuser is arranged is an emission direction of the organic light emitting diodes in front of the carrier substrate to mix the light of different colors of each group leaving the carrier substrate allowing the emission of white light with a high efficacy.

8 Claims, 3 Drawing Sheets

(56) References Cited

U.S. PATENT DOCUMENTS

| | | | |
|---|---|---|---|
| 2006/0083148 A1 | 4/2006 | Yokoyama | |
| 2006/0138945 A1* | 6/2006 | Wolk et al. | 313/506 |
| 2006/0151793 A1* | 7/2006 | Nagai | 257/79 |
| 2006/0170339 A1 | 8/2006 | Kanno et al. | |
| 2007/0159086 A1 | 7/2007 | Yu et al. | |
| 2007/0236135 A1 | 10/2007 | Fukuda et al. | |
| 2009/0160320 A1* | 6/2009 | Borner et al. | 313/504 |

OTHER PUBLICATIONS

RefAbs1: "Light extraction for a doubly resonant cavity organic LED: the RC2 LED",—P. Vandersteegen et al., SPIE, Optics and Photonics 2007.

RefAbs2: "Design of multiwavelength resonant cavities for white organic light-emitting diodes",—Shiga T et al., Jour. Appl. Physics, vol. 93, Issue 1, pp. 19-22, Jan. 2003.

RefAbs3: "OLEDs for lighting applications",—van Elsbergen V et al., Proc. SPIE, vol. 7051, pp. 70511A (9 pp.), 2008.

RefAbs4: "Employing a 2D surface grating to improve light out coupling of a substrate emitting organic LED",—P Vandersteegen et al., Proc. SPIE, vol. 6486, pp. 648601-1-648601-8, Feb. 2007.

D'Andrade et al, "White organic light-emitting devices for solid-state lighting", 2004, pp. 1585-1595, vol. 16, No. 18.

Mladenovski et al., "Light extraction for a doubly resonant cavity organic LED: the RC2 LED", 2007, pp. 66513-1-66513-9, vol. 6655, No. 665513.

Mladenovski et al., "Exceptionally efficient organic light emitting devices using high refractive index substrates", Optics Express, 2009, pp. 7562-7570, vol. 17, No. 9.

\* cited by examiner 15 16 17

LIGHT EMITTING DEVICE BASED ON OLEDS

FIELD OF THE INVENTION

The present invention relates to a light emitting device comprising several groups of organic light emitting diodes (OLEDs) arranged side by side on an optically transparent carrier substrate, said organic light emitting diodes comprising a first layer sequence including at least an organic layer or layer stack between a first and a second electrode layer, said first and said second electrode layers forming a first microcavity, and at least two of the organic light emitting diodes of each group being designed to emit light of a different color.

The organic light emitting diode (OLED) is a promising technology for display and lighting applications. In particular for lighting applications, medium to large area organic light emitting diodes or devices based on such diodes are required. The preparation of medium to large area organic light emitting diodes, especially of the layer structure consisting of organic materials, is usually carried out by thermal evaporation in vacuum on a light transmitting carrier substrate, e.g. of float glass. A typical OLED structure consists of a thin transparent anode, a hole transport layer, a light emission zone, an electron transport layer and a cathode layer. Unfortunately, typically about 50% of the light generated remains in the OLED layer stack, about 25% remains in the substrate and only 20 to 25% is coupled into air and can be used for lighting applications. This portion of light emitted into air can be increased by a number of measures by about 50% to about 36%, which is still too low for an efficient use of the OLED.

BACKGROUND OF THE INVENTION

It has been shown in S. Mladenovski et al., "OLED light outcoupling enhancement by Nelder-Mead layer thickness optimization", 2008 International Conference on the Science and Technology of Emissive Displays and Lighting, EL 2008 Proceedings, pp. 9-12, that for single color OLED devices the light output into air can be about doubled at e.g. the green wavelength region by applying a tuned so called double resonant cavity structure (RC2), i.e. a sequence of high and low index layers with optimized thicknesses between one of the electrodes of the OLED and the substrate. Usually two extra high index layers and one low index layer in between are sufficient to form the additional microcavity.

In order to provide a white light emitting device based on OLEDs, different layers emitting light with different colors, in particular red, green and blue light, are normally combined in one layer stack. Through the combination of the different colors, the device emits the desired white light. In order to improve the luminous power efficacy of such a white light OLED, the above technique of the double resonant cavity structure can not be applied since the tuning of the additional microcavity only improves the efficacy of one of the colors in a range of about 90 nm, wherein outside of this wavelength range the light emission is strongly reduced. Applying this concept for such a white light OLED would thus improve the efficiency only for one color and reduce the radiance of the other colors.

SUMMARY OF THE INVENTION

It is an object of the present invention to provide a light emitting device based on OLEDs, said device allowing the generation of white light with an increased efficacy compared to known white light OLED devices.

The object is achieved with the light emitting device according to claim 1. Advantageous embodiments are subject matter of the dependent claims or are described in the subsequent portions of the description and preferred embodiments.

The proposed light emitting device comprises several groups of stripe shaped organic light emitting diodes arranged side by side on an optically transparent carrier substrate. The organic light emitting diodes comprise a first layer sequence including at least an organic layer or layer stack between a first and a second electrode layer, said first and said second electrode layers forming a first microcavity. The second electrode layer is the layer which is closer to the carrier substrate than the first electrode layer. At least two of the organic light emitting diodes of each group are designed to emit light of a different color. This is achieved as commonly known in the art by selecting an appropriate organic material as ingredient of the emissive layer and by appropriately adapting the length of the first microcavity, especially the distance of the emitting layer to the reflecting cathode. At least one of the organic light emitting diodes of each group comprises a second layer sequence forming a second microcavity between the second electrode layer and the carrier substrate. The second microcavity is adapted in thickness to increase light output of the corresponding organic light emitting diode compared to a case without such a second microcavity. To this end the second microcavity may be adapted in thickness of all of its layers. In some special cases of two or three colors a common optimization may be found for all but one of the layers of the second microcavity, the last layer then being especially tuned for the corresponding color. A scatter or diffuser element is arranged in an emission direction of the organic light emitting diodes in front of the carrier substrate, i.e. on the side of the carrier substrate opposed to the organic light emitting diodes in the case of bottom emission, said element mixing the light of said different colors of each group leaving the carrier substrate.

The present invention thus benefits from the improvement of the luminous power efficacy of single color OLEDs using the technique of the double resonant cavity structure (RC2) as known for example from the cited publication of S. Mladenovski et al. By applying the different single color OLEDs in form of stripes side by side on the optically transparent substrate and mixing the light emitted by these OLEDs with an appropriate diffuser or scattering element, each of the single color OLEDs can be optimized in luminous power efficacy independent of the other OLEDs without reducing the radiance of the other colors which are necessary to achieve a white light emission.

With the arrangement of the diffusing or scattering element also angle dependent color effects of the light emitted by the device are reduced. The diffusing or scattering element may be formed of a scattering foil which is at least arranged at a distance from the emissive layer of the OLEDs which is equal to at least one or two widths of the stripes which form the OLEDs. In case of a sufficiently thick carrier substrate, this foil or layer or other element may be applied directly to the surface of the carrier substrate opposed to the OLED structure.

With the present invention thus the above problem is overcome by manufacturing striped OLEDs with preferably red, green and blue stripes, where a respective second tuned cavity is provided between the second electrode layer and the carrier substrate in the OLEDs of at least one of the three colors. With this measure, the lumen output of the corresponding striped OLED can be more than doubled compared to the planar case of a single resonant cavity OLED. Although the provision of such a double resonant cavity (RC2) for one color is already sufficient to increase the luminous output efficacy of the device, the OLEDs emitting other the colors may also be constructed with such a RC2 structure, which is also of advantage when adjusting the color point of highly efficient white OLEDs.

Preferably, each group of OLEDs comprises OLEDs emitting red, green and blue light. Nevertheless, a group can also be formed of only two OLEDs emitting two different colors which may also be combined to achieve white light. The present invention is also not limited to the emission of white light. Also other mixed colors, i.e. mixed of at least two different colors, may be provided by the device with a high luminous power efficacy.

The optimization of each OLED of the device—or of the selected OLEDs—is made by tuning the additional microcavity to the color of the light emitted by the OLED. Preferably the additional microcavity is formed by a layer sequence of a lower index layer between two higher index layers. The different index layers must not have a λ/4 thickness of the corresponding color. This can be shown by simulations of the emission of such an OLED. Due to the RC2 structure a higher fraction of light is directed into the escape cone of the OLED, resulting in the higher power emission efficiency. The term index in this patent application is used as a synonym for index of refraction.

The luminous power efficacy can be further increased by using a high index glass substrate with an index of refraction of between 1.7 and 1.9 (at 550 nm) as the carrier substrate. Preferably, the substrate index is selected about equal to the average index of the OLED (without the normally not transparent first electrode layer). With the term "about equal" is meant a maximum deviation of about 10% from this average index. Furthermore it is preferred that the difference in index between the higher index layers and the lower index layer of the additional microcavity is as high as possible, at least ≥0.8 (at 550 nm).

In an advantageous embodiment, the tuning of the additional microcavity is performed by adapting only the thickness of one of the high index layers (see above). This has the advantage that the other layers may be applied to the carrier substrate at an equal thickness for all OLEDs of the device and only one of the layers has then to be adapted in thickness, thus reducing the manufacturing costs. The stripe base of the OLED stripes can be defined e.g, by selective etching of the top layer of the additional microcavity or by suitable deposition through a mask. On these stripes as basis then the stripes forming the anode layer, e.g. ITO stripes, are deposited e.g. through a mask or by selective etching of stripes of a resist layer. Finally on top of the anode stripes the OLED stripes are deposited again through a suitable mask and eventually a striped cathode layer, e.g. a Al layer, is on top. If necessary, also small metal current feeds are provided in part of the insulating stripes between the OLED stripes, having contact to one side of the anode. In another embodiment a common anode layer is provided (without intersecting stripes) and the electrical addressing is done via the structured striped cathode.

In a further advantageous embodiment, an array of micro lenses or cylindrical lenses is arranged on the carrier substrate, on the side opposed to the OLED stripes in case of bottom emission. In case of cylindrical lenses these lenses are aligned to the OLED stripes. With these measures, the outcoupling of the light is further improved.

BRIEF DESCRIPTION OF THE DRAWINGS

The proposed device is described in the following by way of example in connection with the accompanying figures without limiting the scope of protection as defined by the claims. The figures show:

DETAILED DESCRIPTION OF EMBODIMENTS

Figure 1:
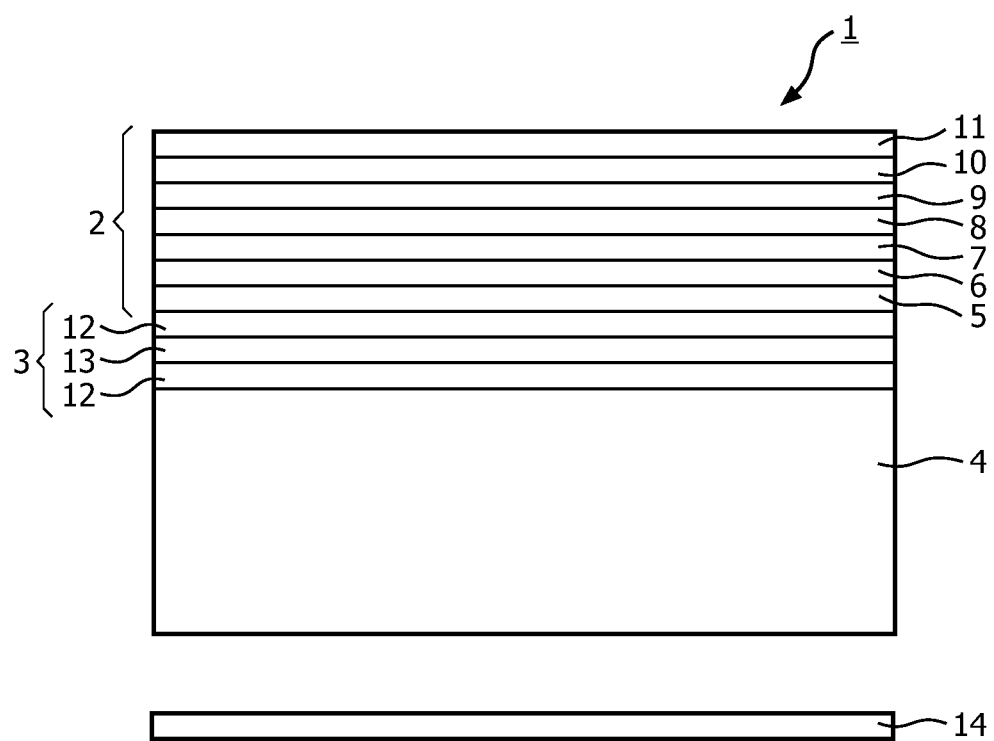
FIG. 1 a schematic view of an exemplary construction of an OLED stripe according to the present invention.

The proposed device of the present invention comprises several groups of stripe shaped OLEDs arranged side by side on an optically transparent carrier substrate. FIG. 1 shows an example of the structure of one of these OLEDs having an optimized RC2 design. This OLED 1 is formed of a first layer structure 2 forming a first microcavity and a second layer structure 3 forming a second microcavity on a carrier substrate 4.

The first layer structure 2 forms a conventional OLED as known in the art. This layer structure 2 comprises a thin transparent anode layer 5, for example of ITO or AZO, a hole injection layer 6, a hole transporting layer 7, an emissive layer 8, an electron transport layer 9, an electron injection layer 10 and a cathode layer 11, for example formed of Al, Ag or any other appropriate metal. The emissive organic layer 8 is the layer in which the electrons and holes recombine to emit the desired light.

The second layer structure 3 is arranged between the anode layer 5 and the carrier substrate 4. This layer structure 3 in the present example comprises a low index layer 13 between two high index layers 12. The high index layers may be formed, for example of $TiO_2$ or GaP, the low index layer 13 may be formed for example of $SiO_2$. The corresponding indices of refraction are n=2.4 for $TiO_2$, n=1.46 for $SiO_2$ and n=3.3 for GaP, all indices of refraction relating to a wavelength of approximately 550 nm. A comparison of measurements of the luminous power efficacy of such an OLED with different layer materials shows that a higher difference in the indices of refraction of the second layer structure 3 increases the outcoupling efficiency, as can be seen in the comparison of $TiO_2$ and GaP.

The light emitted by such an OLED passes through the transparent carrier substrate 4, for example a glass substrate, and is then combined with the emission of adjacent OLEDs of the device by the scattering foil 14 arranged in front of the carrier substrate 4 as schematically indicated in FIG. 1.

TABLE 1

| Layer | Layer thickness [nm] |
|---|---|
| Cathode (Al) | 100 |
| Electron injection | 60 |
| Electron transport | 10 |
| Emissive | 20 |
| Hole transport | 10 |
| Hole injection | 20 |
| Anode (ITO) | 50 |

Table 1 shows the layer thicknesses of the first layer sequence 2 of a red OLED layer design. A typically optimized design of the second layer structure is shown in Table 2 for three different embodiments.

TABLE 2

| | | |
|---|---|---|
| 50 nm ITO | 50 nm ITO | 50 nm ITO |
| 68 nm GaP | 80 nm TiO$_2$ | 222 nm TiO$_2$ |
| 29 nm SiO$_2$ | 114 nm SiO$_2$ | 83 nm SiO$_2$ |
| 61 nm GaP | 59 nm TiO$_2$ | 82 nm TiO$_2$ |
| Substrate: high index glass | Substrate: high index glass | Substrate: float glass |

The high index glass of the first two examples may be made of N-SF57. As can clearly be recognized from the above example, the condition that $\lambda/4=\lambda_0/[4*n(TiO_2)]=d(TiO_2)$ for the single layer thickness of the TiO$_2$ layer must not be fulfilled. With the above not conformal conditions of table 2 an even greater outcoupling of the light is achieved. The same applies to the $\lambda/2$ condition of the SiO$_2$ layer. Instead of SiO$_2$ also another material with a very low index of refraction may be used, for example MgF$_2$ having an index of refraction of n=1.37.

Normally the second layer sequence is chosen to have three to five layers of alternating material and index. It is also possible to use different materials with a high index of refraction for this layer sequence, for example NbO$_x$ and GaP or NbO$_x$ and TiO$_2$.

Figure 2:
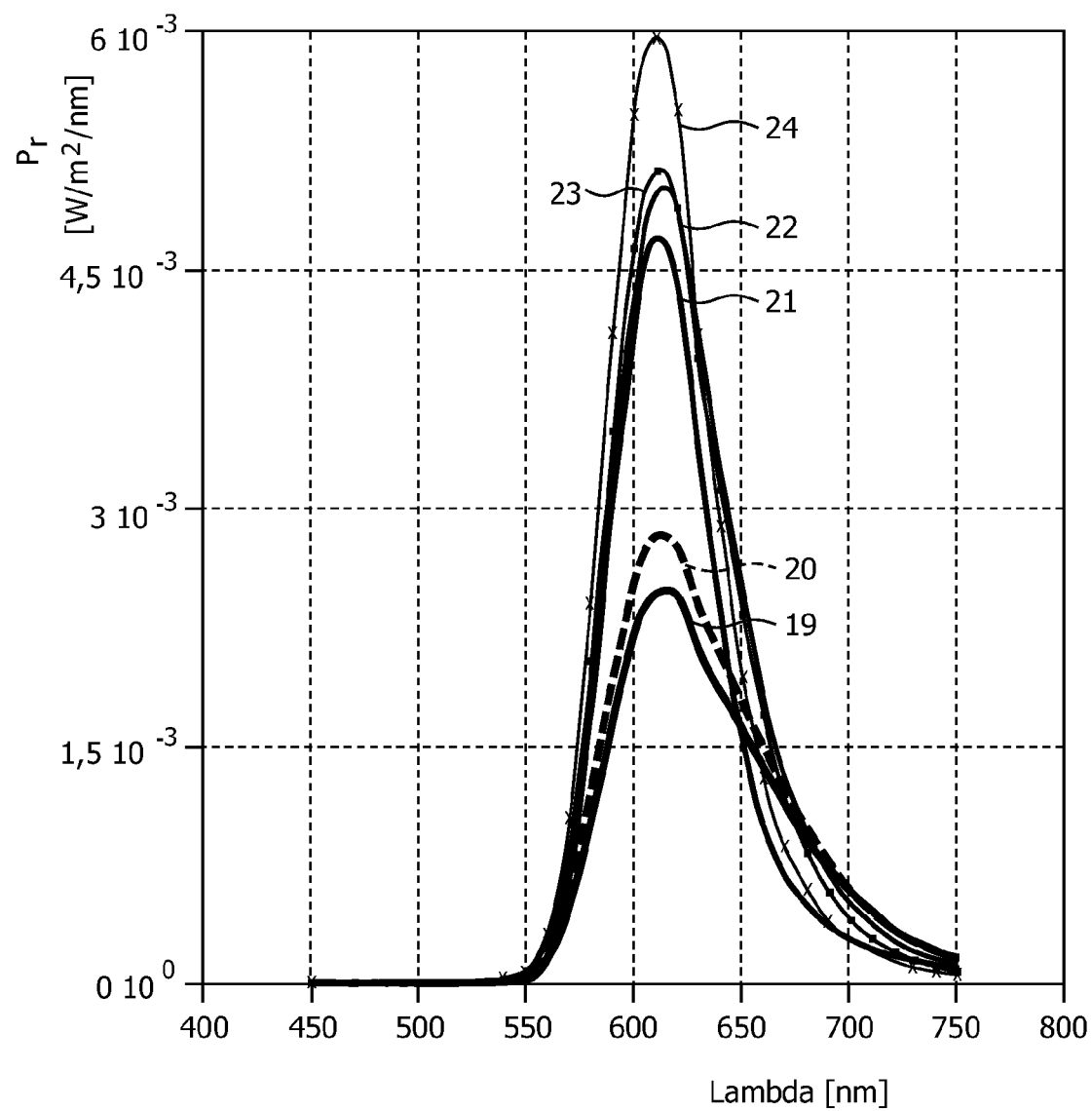
FIG. 2 simulation results for a red OLED stripe with optimized RC2 structure.

FIG. 2 shows an example of the differences in the luminous power efficacy of such a red OLED having a RC2 structure compared to an OLED having only one microcavity, i.e. being composed of only the first layer structure with the same layer parameters as the first layer structure of the OLED with the RC2 structure. In this figure, the curve of the reference OLED having a carrier substrate of float glass is indicated with 19, the curve of the reference OLED having a carrier substrate of high index glass is indicated with 20, the curve of the RC2 OLED having a carrier substrate of float glass (610 nm) and a second layer sequence of TiO$_2$-SiO$_2$-TiO$_2$ is indicated with 21, the curve of the RC2 OLED having a carrier substrate of float glass (620 nm) and a second layer sequence of TiO$_2$-SiO$_2$-TiO$_2$ is indicated with 22, the curve of the RC2 OLED having a carrier substrate of high index glass and a second layer sequence of TiO$_2$-SiO$_2$-TiO$_2$ is indicated with 23 and the curve of the RC2 OLED having a carrier substrate of high index glass and a second layer sequence of GaP-SiO$_2$-GaP is indicated with 24. The results simulated with a simulation program show that the luminous efficacy at the wavelength of 610 nm increases by a factor of 2.4 compared to a reference OLED with only the first layer structure.

The optimization of the second layer structure to achieve the improvement in efficacy is made by adapting the thicknesses of the different layers of this layer structure. Preferably, for all of the OLEDs of the proposed device only one layer of this second layer structure is adapted for the different OLEDs, preferably, the third layer closest to the carrier substrate. This layer is then adapted to the corresponding color of the OLED, in case of a device comprising red, green and blue OLEDs for the red, green and blue OLED in the corresponding different manner.

Further simulations showed that in case of a blue OLED an improvement of a factor of 1.6 is achieved, which is lower than the improvement of a red MED. For a green OLED with the emitting material Irrpy, an improvement by a factor of 2 is possible. Therefore, the improvements with RC2 structures of 3 to 5 layers (2-3 high. index, 1-2 low index) is around 1.6 in the blue wavelength region (480 nm), 2 at the green wavelength region (540 nm) and 2.4 at the red wavelength region (620 nm). In an advantageous embodiment of the inventive device, for example, stripes of red OLEDs having a RC2 structure can be combined with stripes of green OLEDs having a RC2structure and with stripes of blue OLEDs having an RC2 structure. The stripes of blue OLEDs may instead of the RC2 structure be combined with an efficient out-coupling mechanism, for example by use of micro lenses and a carrier substrate with an optically thick high index substrate layer (n =1.75-1.85) of a thickness of some 10 µm between the anode of e.g. no and the substrate of float glass. Such a high index interlayer between the OLED and the carrier substrate can also be provided together with the RC2 structures and then is arranged between the carrier substrate and the second layer structure.

Figure 3:
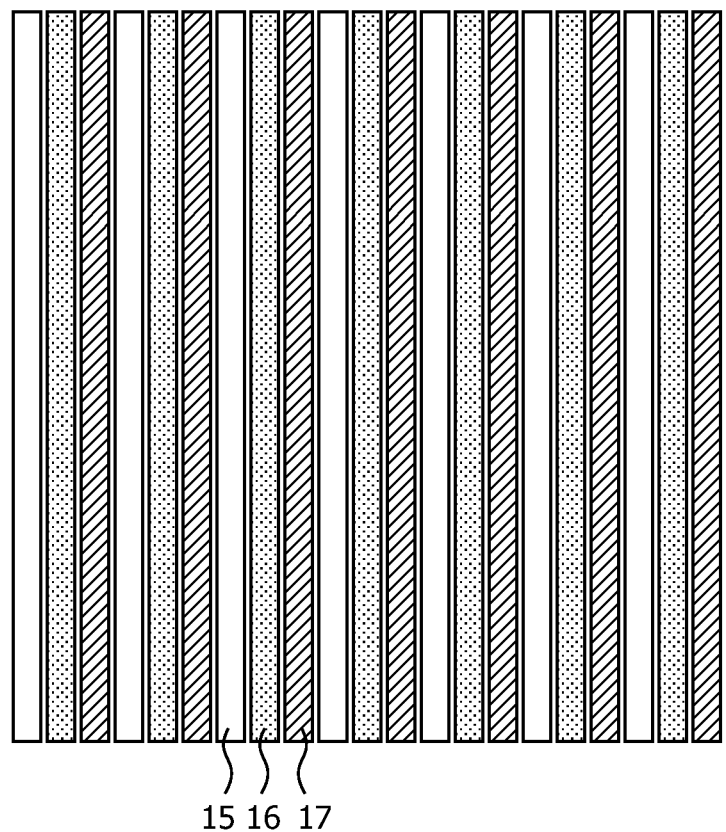
FIG. 3 an arrangement of the OLED stripes according to an example of the present invention.

FIG. 3 shows a schematic arrangement of the OLED stripes of an exemplary embodiment of the present device. In this case the different stripes of the OLEDs of different colors have the same widths, which is however not mandatory. The widths of the OLEDs of different colors may also be different accounting for the different emission efficacy, in order to achieve white light. The figure shows seven groups of OLEDs, each group been formed of a red OLED 15, a green OLED 16 and a blue OLED 17. Such a device has typical dimensions of a height H and width W of 32×34 mm$^2$ or 50×50 mm$^2$. The fill factor is between 80 and 90%. Typically the widths of the single stripes are between 0.2 and 5 mm, preferably between 1 and 3 mm. The widths of the stripes can be adapted to the efficacy of the corresponding emitters and the intended white light spectrum (for example warm white) or to the desired color point. This means that the widths of the stripes for red, green and blue can be different. For example, the widths of the efficient green emitter may be approximately half of the widths of the red or blue emitter or the green and blue emitter together may have a (added) width which is equal to the width of the red emitter.

In the gaps between the single stripes two electrical conduction stripes, separated by an electrical isolation stripe, are arranged for contacting the anode and cathode of the corresponding OLED stripes. For example, the electrical conduction stripe for contacting the cathode may be arranged for all OLED stripes on the left or on right of the OLED stripes. The red, green and blue OLED stripes are electrically supplied in parallel. In this embodiment, a current control is performed with a separate voltage for red, green and blue (three power supplies). The scattering foil and the electrical connections and power supplies are not shown in FIG. 3.

Taking into account the exemplary luminous efficacies for red, green and blue of approximately 30 lm/W red, 60 lm/W green and 10 lm/W blue (at 1000 nit; 1 nit=1 cd/m$^2$=1 lm/(sr*m$^2$)) and taking into account the spectral averages of the improved light out-coupling (ILO) of approximately half of the maximal improvement, values are achieved for red of approximately 51 lm/W, for green of approximately 90 lm/W and for blue of approximately 13 lm/W. For a warm white stripe OLED, a weighting of the spectra for red (for example: ADS076), for green (for example: double emission Irrpy) and for blue (for example: BD-119) of 1:0.4:0.2 is achieved. This means a total efficacy for the white combined spectrum of 63 lm/W and a color point of x=0.485 and y=0.425. At a spectral composition of R:G:B of 1:0.5:0.25 an efficacy in white of 66 lm/W and a color point of x=0.465 and y=0.425 are achieved. This is a significant improvement compared to the present record data for OLLA III hybrid white of 50 lm/W.

Instead of comprising OLEDs of three different colors the present device may also be composed of OLEDs of only two different colors. In particular the combination red/turquoise may be advantageous, in which the RC2 structure is used for the red OLED and an out-coupling scatter foil, for example from micro lenses, or scatter particles are used to improve the outcoupling efficiency of the turquoise OLED. Another example is a combination of blue and yellow. In this case, the RC2 structure may used for the blue OLED and an outcoupling scattering foil max be directly applied to the substrate for the yellow OLED or vice versa.

The diffusing or scattering element or foil or layer of scattering particles which is used to mix the different colors may also be applied directly to the carrier substrate in case of a relatively thick substrate of for example 3 to 5 mm, i.e. preferably thicker than the widths of the single stripes.

Figure 4:
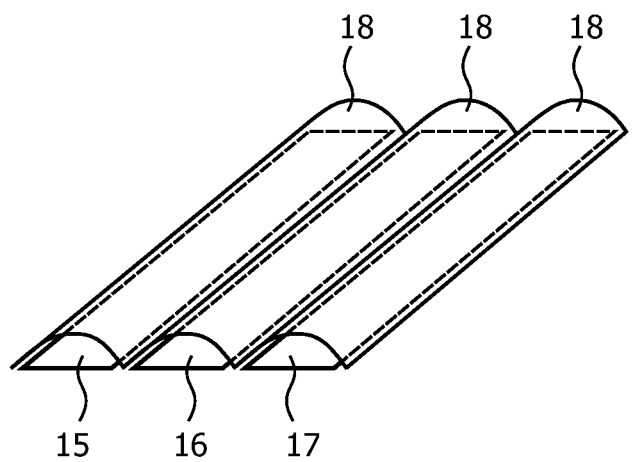
FIG. 4 a schematic view of the arrangement of cylindrical lenses in order to improve the outcoupling efficiency of the proposed device.

For optimal light outcoupling it is preferred to additionally apply cylindrical lenses 18 to the carrier substrate. These cylindrical lenses are preferably aligned along the OLED stripes of the red 15, green 16 and blue OLED 17 as is schematically indicated in FIG. 4. The cylindrical lenses 18 can also be realized by a compact plate with a suitable half cylindrical profile and may be applied by means of a index matching fluid or index matching adhesive to the carrier substrate. The half cylindrical lenses have an effect for the middle of the corresponding stripe like a micro extractor which very efficiently couples out light. Such cylindrical lenses are applied in addition to the diffuser or scatter element for mixing the different colors.

While the invention has been illustrated and described in detail in the drawings and forgoing description, such illustration and description are to be considered illustrative or exemplary and not restrictive. The invention is not limited to the disclosed embodiments. The different embodiments described above and in the claims can also be combined. Other variations to the disclosed embodiments can be understood and effected by those skilled in the art in practicing the claimed invention, from the study of the drawings, the disclosure and the appended claims. For example, the present invention is not limited to the generation of white light. The different colors of the OLED stripes may also be used to achieve a uniform colored light. Furthermore, the dimensions of the device as described in the exemplary embodiments are not limited to the indicated dimensions. The skilled person will select these dimensions as well as the different colors of the OLED stripes and their corresponding dimensions dependent on the desired optical effect.

In the claims, the word "comprising" does not exclude other elements or steps, and the indefinite article "a" or "an" does not exclude a plurality. The mere fact, that the measures are recited in mutually different dependent claims does not indicate that a combination of these measures can not be used to advantage. The reference signs in the claims should not be construed as limiting the scope of these claims.

| LIST OF REFERENCE SIGNS: | |
|---|---|
| 1 | OLED |
| 2 | first layer sequence |
| 3 | second layer sequence |
| 4 | carrier substrate |
| 5 | anode layer |
| 6 | hole injection layer |
| 7 | hole transport layer |
| 8 | emissive layer |
| 9 | electron transport layer |
| 10 | electron injection layer |
| 11 | cathode layer |
| 12 | high index layer |
| 13 | low index layer |
| 14 | scattering foil |
| 15 | red OLED stripe |
| 16 | green OLED stripe |
| 17 | blue OLED stripe |
| 18 | cylindrical lens |
| 19 | Reference OLED (float) |
| 20 | Reference OLED (high index) |
| 21 | RC2 OLED (float, 610 nm) |
| 22 | RC2 OLED (float, 620 nm) |
| 23 | RC2 OLED (high index, 610 nm) |
| 24 | RC2 OLED GaP (high index, 610 nm) |

The invention claimed is:

1. A light emitting device comprising a plurality of groups of stripe shaped organic light emitting diodes arranged side by side on an optically transparent carrier substrate, said organic light emitting diodes comprising a first layer sequence including at least an organic layer or layer stack between a first electrode layer and a second electrode layer, said first and said second electrode layers forming a first microcavity, said second electrode layer being closer to the carrier substrate than the first electrode layer, at least two of the organic light emitting diodes of each group being configured to emit light of a different color,
wherein at least one of the organic light emitting diodes of each group comprises a second layer sequence forming a second microcavity between the second electrode layer and the carrier substrate, the second microcavity being adapted in thickness of at least one of its layers to increase light output of the corresponding organic light emitting diode, and
wherein a scatter or diffuser element is arranged in an emission direction of the organic light emitting diodes in front of the carrier substrate, said scatter or diffuser element mixing the light of said different colors of each group leaving the carrier substrate.

2. The device according to claim 1, wherein the second layer sequence comprises at least a lower index layer between two higher index layers.

3. The device according to claim 1, wherein the carrier substrate is a high index glass substrate with an index between 1.7 and 1.9.

4. The device according to claim 1, wherein the carrier substrate is a glass substrate, the index of which being within a range of +/−10% of an average index of the first layer sequence without the first electrode.

5. The device according to claim 2, wherein a difference in index between the higher index layers and the lower index layer of the second layer sequence is at least 0.8.

6. The device according to claim 2, wherein said adaptation of the second microcavity in thickness of at least one of its layers is achieved by varying the thickness of only one of the higher index layers.

7. The device according to claim 1, wherein each group comprises organic light emitting diodes emitting red, green and blue light.

8. The device according to claim 1, wherein microlenses or cylindrical lenses are attached to the carrier substrate, thereby improving outcoupling of the light.

\* \* \* \* \*